United States Patent
Kim

(10) Patent No.: US 9,870,832 B2
(45) Date of Patent: Jan. 16, 2018

(54) CONTROL SIGNAL GENERATION CIRCUIT AND NON-VOLATILE MEMORY DEVICE INCLUDING THE SAME

(71) Applicant: SK hynix Inc., Gyeonggi-do (KR)

(72) Inventor: Byung-Ryul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/421,009

(22) Filed: Jan. 31, 2017

(65) Prior Publication Data

US 2017/0140834 A1 May 18, 2017

Related U.S. Application Data

(62) Division of application No. 14/858,818, filed on Sep. 18, 2015, now Pat. No. 9,595,306.

(30) Foreign Application Priority Data

Mar. 31, 2015 (KR) ........................ 10-2015-0045206

(51) Int. Cl.
G11C 16/34 (2006.01)
G11C 16/04 (2006.01)
G11C 16/26 (2006.01)
G11C 16/14 (2006.01)

(52) U.S. Cl.
CPC ...... *G11C 16/3459* (2013.01); *G11C 16/0483* (2013.01); *G11C 16/14* (2013.01); *G11C 16/26* (2013.01)

(58) Field of Classification Search
None
See application file for complete search history.

(56) References Cited

U.S. PATENT DOCUMENTS

2009/0290429 A1* 11/2009 Dong ................. G11C 11/5628
365/185.25

* cited by examiner

*Primary Examiner* — James G Norman
(74) *Attorney, Agent, or Firm* — IP & T Group LLP

(57) ABSTRACT

A control signal generation circuit may include: a counting unit suitable for generating counting information; a first signal generation unit suitable for activating/deactivating a first signal based on the counting information, first rising information, and first falling information; a second signal generation unit suitable for activating/deactivating a second signal based on the counting information, second rising information, second falling information, and the first falling information; and a control signal driving unit suitable for driving a control signal in response to the first and second signals.

11 Claims, 6 Drawing Sheets

CONTROL SIGNAL GENERATION CIRCUIT AND NON-VOLATILE MEMORY DEVICE INCLUDING THE SAME

CROSS-REFERENCE TO RELATED APPLICATIONS

This application is a division of U.S. patent application Ser. No. 14/858,818 filed on Sep. 18, 2015, which claims priority of Korean Patent Application No. 10-2015-0045206, filed on Mar. 31, 2015. The disclosure of each of the foregoing application which is incorporated herein by reference in its entirety.

BACKGROUND

1. Field

Exemplary embodiments of this patent document relate to a semiconductor design technology and, more particularly, to a control signal generation circuit and a nonvolatile memory device including the same.

2. Description of the Related Art

Semiconductor memory devices are divided into volatile memory devices and nonvolatile memory devices. Volatile memory devices have higher write and read speeds, but cannot retain data without a constant source of power. Nonvolatile memory devices have slower write and read speeds, but can retain data even without a constant source of power. Therefore, nonvolatile memory devices are used to store data that must be retained regardless of whether there is a constant source of power available. Nonvolatile memory devices include Read Only Memory (ROM), Mask ROM (MROM), Programmable ROM (PROM), Erasable Programmable ROM (EPROM), Electrically Erasable Programmable ROM (EEPROM), flash memory, Phase change Random Access Memory (PRAM), Magnetoresistive RAM (MRAM), Resistive RAM (RRAM), and Ferroelectric RAM (FRAM). Flash memory is divided into NOR and NAND types.

Flash memory not only has the advantage of RAM, in that it may be freely programmed or erased, but it also has the advantage of ROM, in that it can retain data even without a constant source of power. Flash memory is widely used as a storage medium in portable electronic device such as digital cameras, Personal Digital Assistants (PDA), and MP3 players.

In order to increase the data storage capacity of a memory device, more memory cells must be formed in a limited area. This means that the size of the memory cells needs to be reduced. However, since the ability to reduce the size of memory cells is limited, a three-dimensional (3D) memory device including memory cells that are vertically stacked on a semiconductor substrate has been proposed. In a highly integrated 3D memory device, signals are transmitted to different parts of the memory device through various transmission lines. However, when loading of the transmission lines is increased, a mismatch may occur between the timings at which the signals are transmitted, thereby negatively influencing the operation of the memory device.

SUMMARY

Various embodiments are directed to a control signal generation circuit capable of minimizing influence of a timing mismatch between signals due to line loading by activating a signal for controlling a transistor coupling half strings, in advance, and a nonvolatile memory device Including the same.

Also, various embodiments are directed to a control signal generation circuit capable of flexibly adjusting an activation or deactivation point of a control signal by activating or deactivating the control signal through two steps.

In an embodiment, a control signal generation circuit may Include: a counting unit suitable for generating counting information by counting a clock during first and second periods; a first signal generation unit suitable for activating a first signal when the counting information is greater than or equal to first rising information during the first period, and deactivating the first signal when the counting information is greater than or equal to first falling information during the second period; a second signal generation unit suitable for activating a second signal at a start point of the first period, deactivating the second signal when the counting information is greater than or equal to second rising information during the first period, and activating the second signal when the counting information is greater than or equal to second falling information and deactivating the second signal when the counting information is greater than or equal to the first falling information during the second period; and a control signal driving unit suitable for driving a control signal to a pre-active level when the first and second signals are activated, and driving the control signal to an active level higher than the pre-active level when the first signal is activated and the second signal is deactivated, when a first mode is set.

In an embodiment, a nonvolatile memory device may include: a pipe transistor controlled in response to a pipe control signal; a first half string including a plurality of first memory cells coupled in series between a bit line and the pipe transistor; a second half string including a plurality of second memory cells coupled in series between a source line and the pipe transistor; and a pipe control signal generation unit suitable for activating the pipe control signal through two steps at time points set by first and second rising information and deactivating the pipe control signal through two steps at time points set by first and second falling information during a read or verify operation, when a first mode is set.

In an embodiment, a control signal generation circuit may include: a storage unit suitable for storing first and second rising information and first and second falling information; and a control signal generation unit suitable for pre-activating a control signal at a first time point set by the first rising information, activating the control signal at a second time point set by the second rising information, pre-deactivating the control signal at a third time point set by the second falling information, and deactivating the control signal at a fourth time point set by the first falling information, when a first mode is set.

DETAILED DESCRIPTION

Figure 1:
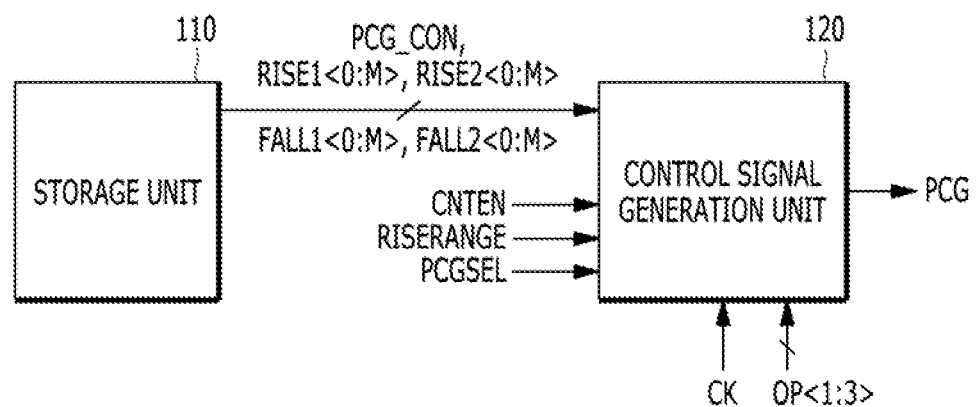
FIG. 1 is a block diagram illustrating a control signal generation circuit in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

FIG. 1 is a block diagram illustrating a control signal generation circuit in accordance with an embodiment of the present invention.

Referring to FIG. 1, the control signal generation circuit may include a storage unit 110 and a control signal generation unit 120. Hereafter, a first mode may refer to a mode in which pre-activation and pre-deactivation are used, and a second mode may refer to a mode in which the pre-activation and the pre-deactivation are not used. A control signal PCG generated by the control signal generation circuit of FIG. 1 may be activated or deactivated through two steps when the first mode is set, and activated or deactivated through one step when the second mode is set.

The storage unit 110 may store first and second rising information RISE1<0:M> and RISE2<0:M> and first and second falling information FALL1<0:M> and FALL2<0:M>, where M is a natural number. When the first mode is set, the first rising information RISE1<0:M> may determine a pre-activation point of the control signal PCG, i.e., a first time point, the second rising information RISE2<0:2> may determine an activation point of the control signal PCG, i.e., a second time point, the second falling information FALL2<0:M> may determine a pre-deactivation point of the control signal PCG, i.e., a third time point, and the first falling information FALL1<0:M> may determine a deactivation point of the control signal PCG, a fourth time point. The values of the respective pieces of information RISE1<0:M>, RISE2<0:M>, FALL1<0:M>, and FALL2<0:M> may be controlled.

As the values of the respective pieces of information RISE1<0:M>, RISE2<0:M>, FALL1<0:M>, and FALL2<0:M> are decreased, the time points corresponding to the respective pieces of information may be advanced. On the other hand, as the values of the respective pieces of information RISE1<0:M>, RISE2<0:M>, FALL1<0:M>, and FALL2<0:M> are increased, the time points corresponding to the respective pieces of information may be delayed. For example, the first time point may be advanced as the value of the first rising information RISE1<0:M> is decreased, and delayed as the value of the first rising information RISE1<0:M> is increased. The second rising information RISE2<0:M> may have a larger value than the first rising information RISE1<0:M>, and the first failing information FALL1<0:M> may have a larger value than the second falling information FALL2<0:M>.

When the first mode is set, the pre-activation may indicate an operation of changing the control signal PCG from an inactive level to a pre-active level, activation may indicate an operation of changing the control signal PCG from the pre-active level to an active level, the pre-deactivation may indicate an operation of changing the control signal PCG from the active level to the pre-active level, and deactivation may indicate an operation of changing the control signal PCG from the pre-active level to the inactive level. For reference, the pre-active level may indicate a predetermined level between the inactive level and the active level. When the active level is higher than the inactive level, the pre-active level may indicate a predetermined level higher than the inactive level and lower than the active level, and when the inactive level is higher than the active level, the pre-active level may indicate a predetermined level higher than the active level and lower than the inactive level.

For reference, the storage unit 110 may include a plurality of nonvolatile memory elements for storing the respective pieces of information RISE1<0:M>, RISE2<0:M>, FALL1<0:M>, and FALL2<0:M>. The nonvolatile memory elements may include various elements such as fuses, anti-fuses, variable resistance elements, and floating gate elements. Furthermore, the storage unit 110 may store information on whether the first mode or the second mode is set, and generate a mode signal PCG_CON based on the stored information. When the first mode is set, the mode signal PCG_CON may be activated, and when the second mode is set, the mode signal PCG_CON may be deactivated.

The control signal generation unit 120 may generate the control signal PCG, and pre-activate, activate, pre-deactivate, or deactivate the control signal PCG at a time point set by the Information RISE1<0:M>, RISE2<0:M>, FALL1<0:M>, or FALL2<0:M>, when the first mode is set. Furthermore, the control signal generation unit 120 may activate or deactivate the control signal PCG at a predetermined time point without pre-activating and pre-deactivating the control signal PCG, when the second mode is set.

The control signal generation unit 120 may pre-activate the control signal PCG at the first time point set by the first rising information RISE1<0:M>, activate the control signal PCG at the second time point set by the second rising information RISE2<0:M>, pre-deactivate the control signal PCG at the third time point set by the second falling Information FALL2<0:M>, and deactivate the control signal PCG at the fourth time point set by the first falling information FALL1<0:M>.

More specifically, the control signal generation unit 120 may count a clock CK, compare the counting value (hereafter, referring to as "counting Information") with the respective pieces of Information RISE1<0:M>, RISE2<0:M>, FALL1<0:M>, and FALL2<0:M>, and determine the first to fourth time points. During a first period, the control signal generation unit 120 may pre-activate the control signal PCG when the counting information is greater than or equal to the first rising information RISE1<0:M>, and activate the control signal PCG when the counting information is greater than or equal to the second rising information RISE2<0:M>. Furthermore, during a second period, the control signal generation unit 120 may pre-deactivate the control signal PCG when the counting information is greater than or equal to the second falling information FALL2<0:M>, and deactivate the control signal PCG when the counting information is greater than or equal to the first falling information FALL1<0:M>.

For reference, the first period may indicate a predetermined period which is set to perform an operation of changing the control signal PCG from an inactive state to an active state, and the second period may indicate a predetermined period which is set to perform an operation of changing the control signal PCG from the active state to the inactivate state. The first and second time points may be selectively adjusted within the first period, and the third and fourth time points may be selectively adjusted within the second period. In FIG. 1, a signal CNTEN may be activated during the first and second periods, and a signal RISERANGE may be activated during the first period.

When the second mode is set, the control signal generation unit 120 may activate or deactivate the control signal PCG in response to a signal PCGSEL. The control signal generation unit 120 may change the control signal PCG from the inactive state to the active state when the signal PCGSEL is activated, and change the control signal PCG from the active state to the inactive state when the signal PCGSEL is deactivated. When the second mode is set, the control signal PCG may be directly activated or deactivated without passing through the pre-active level.

The active level and pre-active level of the control signal PCG may differ depending on an operation of a semiconductor device including the control signal generation circuit. For example, suppose that the control signal PCG controls a pipe transistor in a nonvolatile memory device. The active level of the control signal PCG may be set to an erase voltage when the nonvolatile memory device performs an erase operation, or set to a pass voltage when the nonvolatile memory device performs a read, program, or verify operation. Furthermore, the pre-active level may be lower by a predetermined level than the active level.

The control signal generation circuit may activate the control signal PCG through the steps, and control when the level of the control signal PCG is changed. Thus, the control signal PCG may have a waveform suitable for a device controlled by the control signal PCG.

Figure 2:
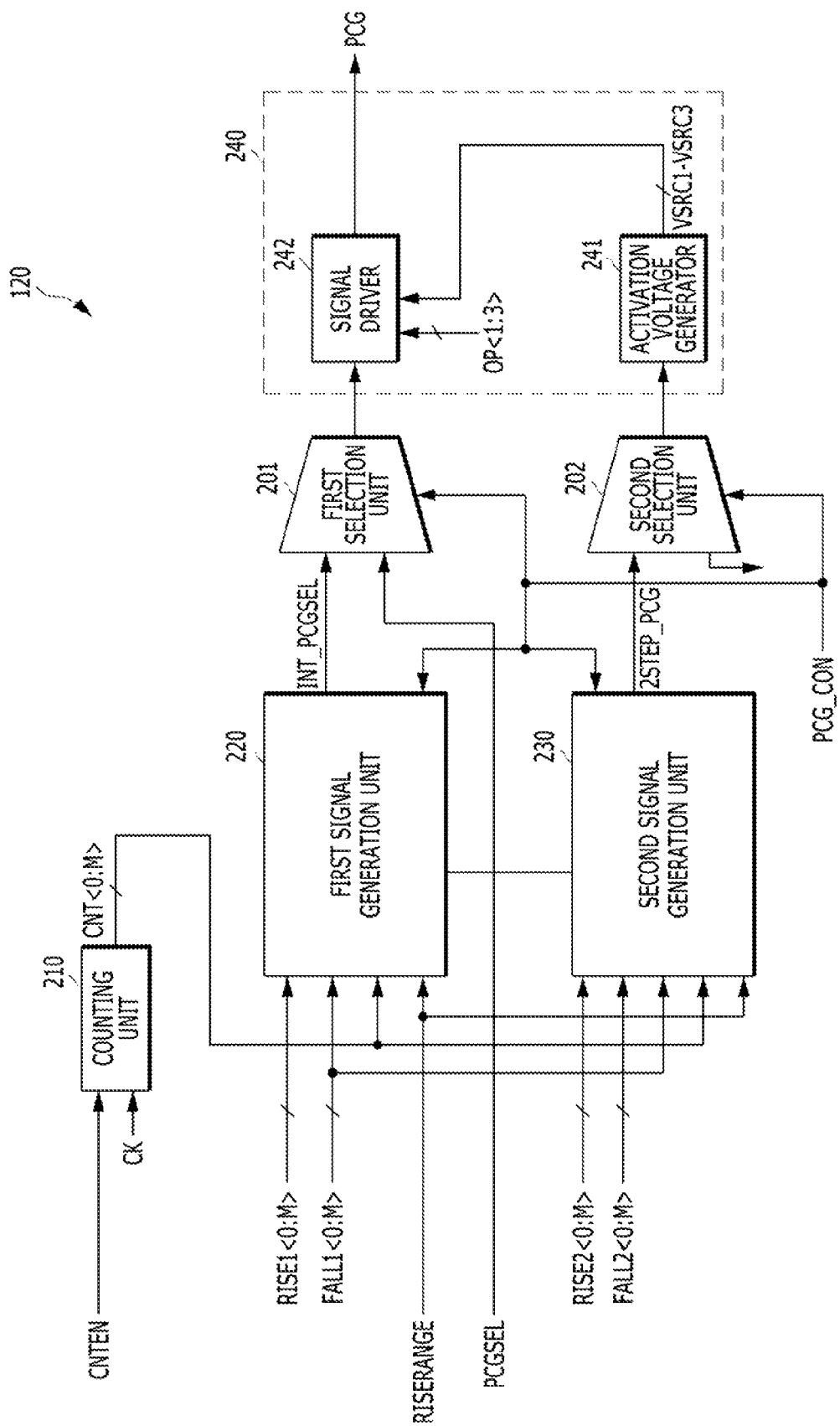
FIG. 2 is a block diagram illustrating a control signal generation unit illustrated in FIG. 1.

FIG. 2 is a block diagram illustrating the control signal generation unit 120 illustrated in FIG. 1.

Referring to FIG. 2, the control signal generation unit 120 may include a counting unit 210, a first signal generation unit 220, a second signal generation unit 230, a control signal driving unit 240, a first selection unit 201, and a second selection unit 202.

The counting unit 210 may generate counting information CNT<0:M> by counting the clock CK during the first and second periods. When the signal CNTEN is activated, the counting unit 210 may count the clock CK. When the signal CNTEN is deactivated, the counting unit 210 may be maintained in a reset state without counting. Thus, during the first period, the value of the counting information CNT<0:M> may correspond to the time which has elapsed from when the first period was started. During the second period, the value of the counting information CNT<0:M> may correspond to the time which has elapsed from when the second period was started.

When the mode signal PCG_CON is activated, the first signal generation unit 220 may generate a first signal INT_PCGSEL in response to the counting information CNT<0:M>, the first rising information RISE1<0:M>, and the first falling information FALL1<0:M> during the first period. The first signal generation unit 220 may activate the first signal INT_PCGSEL when the counting signal CNT<0:M> is greater than or equal to the first rising information RISE1<0:M> during the first period in which both of the signals CNTEN and RISERANGE are activated, and deactivate the first signal INT_PCGSEL when the counting signal CNT<0:M> is greater than or equal to the first falling information FALL1<0:M> during the second period in which the signal CNTEN is activated and the signal RISERANGE is deactivated. The first signal generation unit 220 may be disabled when the mode signal PCG_CON is deactivated.

When the mode signal PCG_CON is activated, the second signal generation unit 230 may generate a second signal 2STEP_PCG in response to the counting information CNT<0:M>, the second rising information RISE2<0:M>, and the first and second falling information FALL1<0:M> and FALL2<0:M>. The second signal generation unit 230 may activate the second signal 2STEP_PCG at a start point of the first period in which both of the signals CNTEN and RISERANGE are activated, deactivate the second signal 2STEP_PCG when the counting information CNT<0:M> is greater than or equal to the second rising information RISE2<0:M> during the first period. Further, during the second period, the second signal generation unit 230 may activate the second signal 2STEP_PCG when the counting information CNT<0:M> is greater than or equal to the second falling information FALL2<0:M>, and deactivate the second signal 2STEP_PCG when the counting information CNT<0:M> is greater than or equal to the first falling information FALL1<0:M>. The second signal generation unit 230 may be disabled when the mode signal PCG_CON is deactivated.

The first selection unit 201 may select the first signal INT_PCGSEL when the mode signal PCG_CON is activated, and select the signal PCGSEL when the mode signal PCG_CON is deactivated. The second selection unit 202 may select the second signal 2STEP_PCG when the mode signal PCG_CON is activated, and select a ground voltage when the mode signal PCG_CON is deactivated.

When the first mode is set, the control signal driving unit 240 may drive the control signal PCG to the pre-active level when both of the first signal INT_PCGSEL and the second signal 2STEP_PCG are activated, and drive the control signal PCG to the active level when the first signal INT_PCGSEL is activated and the second signal 2STEP_PCG is deactivated. The control signal driving unit 240 may drive the control signal PCG to the inactive level when the first signal INT_PCGSEL is deactivated. When the second mode is set, the control signal driving unit 240 may drive the control signal PCG to the active level when the signal PCGSEL is activated, and drive the control signal PCG to the inactive level when the signal PCGSEL is deactivated.

The control signal driving unit 240 may include an activation voltage generator 241 and a signal driver 242. The activation voltage generator 241 may generate activation voltages VSRC1 to VSRC3 which have the active level when the second signal 2STEP_PCG is deactivated, and have the pre-active level when the second signal 2STEP_PCG is activated. The activation voltages VSRC1 to VSRC3 may have the active level when the second signal 2STEP_PCG is deactivated, and have different pre-active levels lower by a predetermined level than the active levels when the second signal 2STEP_PCG is activated.

For example, when the active levels of the activation voltages VSRC1, VSRC2, and VSRC3 are respectively set to 1V, 2V, and 3V and the predetermined level is set to 0.5V, the activation voltage generator 241 may generate the activation voltages VSRC1, VSRC2, and VSRC3 of 1V, 2V, and 3V when the second signal 2STEP_PCG is deactivated, and generate the activation voltages VSRC1, VSRC2, and VSRC3 of 0.5V (1V−0.5V), 1.5V (2V−0.5V), and 2.5V (3V−0.5V) when the second signal 2STEP_PCG is activated.

When the first mode is set, the signal driver 242 may drive the control signal PCG to a deactivation voltage, for example, the ground voltage, having the inactive level, for example, a ground voltage level, when the first signal INT_PCGSEL is deactivated, and drive the control signal PCG to an activation voltage selected from the activation voltages VSRC1 to VSRC3 when the first signal INT_PCGSEL is activated. Each of the activation voltages VSRC1 to VSRC3 may be selected when a corresponding operation signal of operation signals OP<1:3> is activated. For example, the activation voltage VSRC1 may be selected when the operation signal OP<1> is activated, the activation voltage VSRC2 may be selected when the operation signal OP<2> is activated, and the activation voltage VSRC3 may be selected when the operation signal OP<3> is activated. FIG. 2 illustrates an example where three types of activation voltages are generated. However, one or more types of activation voltages may be generated depending on design.

When the second mode is set, the signal driver 242 may drive the control signal PCG to the deactivation voltage when the signal PCGSEL is deactivated, and drive the control signal PCG to the activation voltage when the signal PCGSEL is activated.

Figure 3:
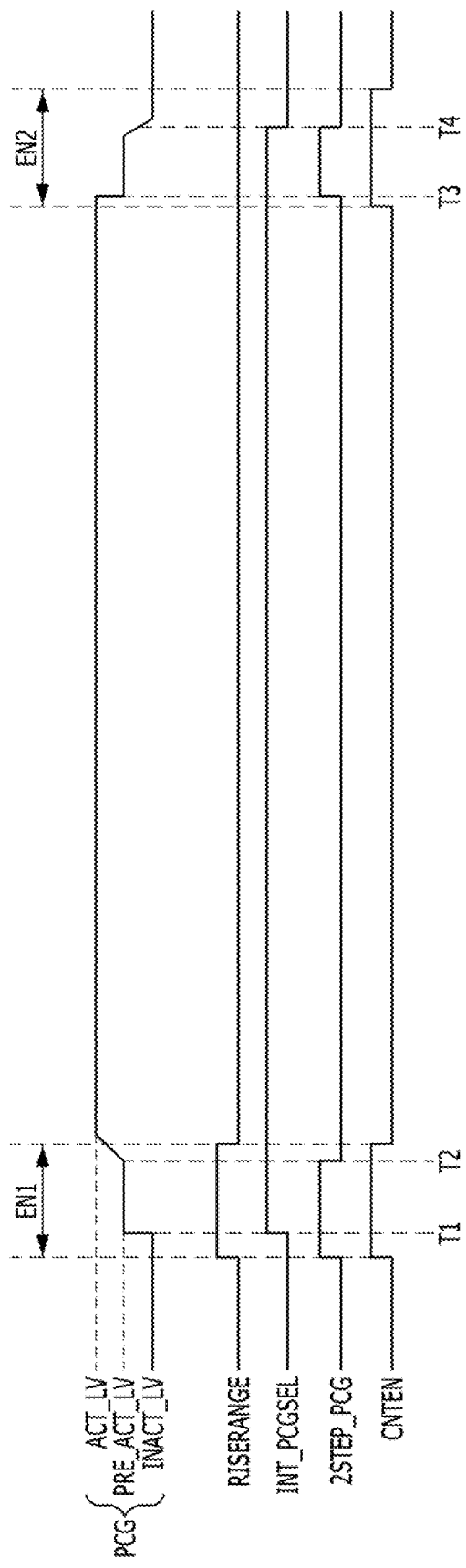
FIG. 3 is a timing diagram for describing an operation of the control signal generation circuit of FIG. 1.

FIG. 3 is a timing diagram for describing an operation of the control signal generation circuit of FIG. 1.

Referring to FIG. 3, the operation of the control signal generation circuit is described using waveforms of the signal CNTEN, the signal RISERANGE, the first signal INT_PCGSEL, the second signal 2STEP_PCG, and the control signal PCG.

When the signal CNTEN is activated, the counting unit 210 may generate the counting information CNT<0:M>. At a start point of a first period EN1 in which both of the signals CNTEN and RISERANGE are activated, the second signal 2STEP_PCG may be activated. During the first period EN1, the first signal INT_PCGSEL may be activated when the value of the counting information CNT<0:M> is greater than or equal to the first rising information RISE1<0:M> at a first time point T1, and the second signal 2STEP_PCG may be deactivated when the value of the counting information CNT<0:M> is greater than or equal to the second rising information RISE2<0:M> at a second time point T2.

During a second period EN2 in which the signal RISERANGE is deactivated and the signal CNTEN is activated, the second signal 2STEP_PCG may be activated when the value of the counting Information CNT<0:M> is greater than or equal to the second falling information FALL2<0:M> at a third time point T3, and the first signal INT_PCGSEL and the second signal 2STEP_PCG may be deactivated when the counting Information CNT<0:M> is greater than or equal to the first falling information FALL1<0:M> at a fourth time point T4.

The control signal PCG may be pre-activated to a pre-active level PRE_ACT_LV from an inactive level INACT_LV at the first time point T1, activated to an active level ACT_LV from the pre-active level PRE_ACT_LV at the second time point T2, pre-deactivated to the pre-active level PRE_ACT_LV from the active level ACT_LV at the third time point T3, and deactivated to the inactive level INACT_LV from the pre-active level PRE_ACT_LV at the fourth time point T4.

Figure 4:
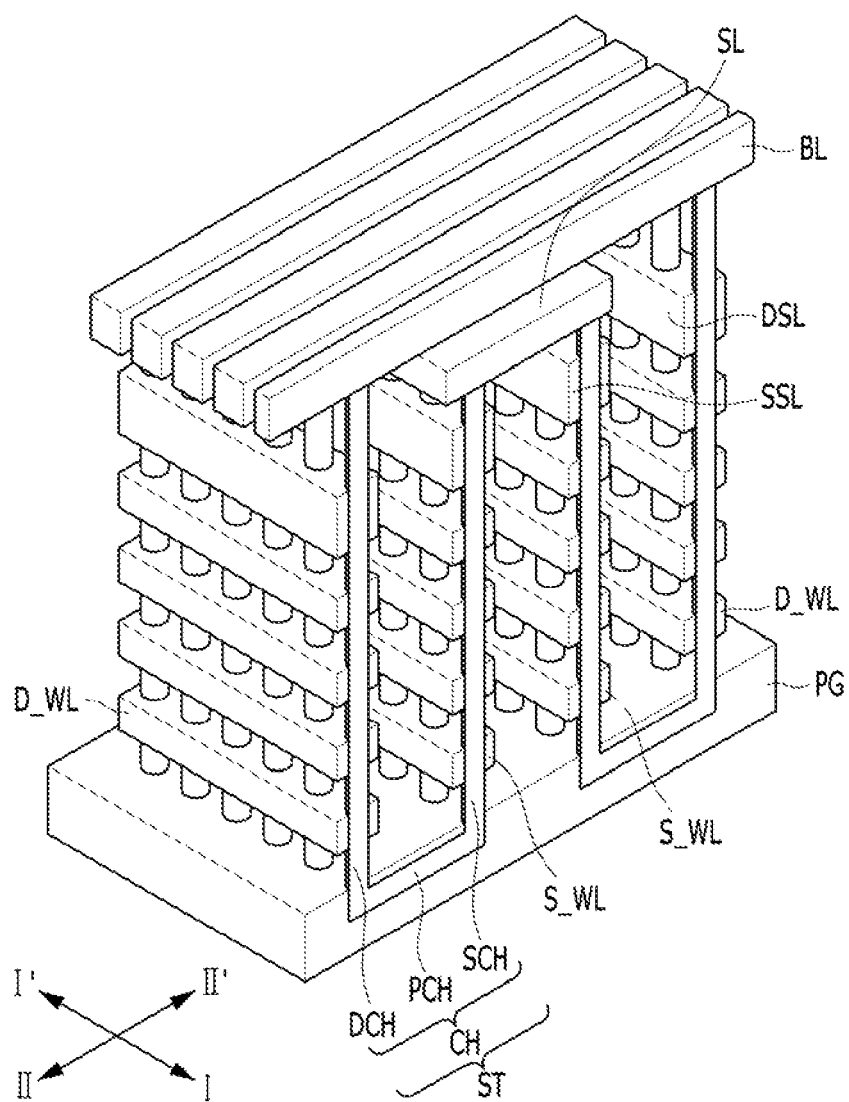
FIG. 4 is a perspective view illustrating a structure of a 3D nonvolatile memory device.

FIG. 4 is a perspective view illustrating a structure of a 3D nonvolatile memory device. For convenience, interlayer dielectric layers are not illustrated in FIG. 4.

Referring to FIG. 4, the 3D nonvolatile memory device may include a pipe channel PCH buried in a pipe gate PG, a source-side half channel SCH, and a drain-side half channel DCH. The source-side half channel SCH and the drain-side half channel DCH may be connected to the pipe channel PCH. The source-side half channel SCH, the pipe channel PCH, and the drain-side half channel DCH may form one full channel CH.

The memory device may further include source-side word lines S_WL and drain-side word lines D_WL. The source-side word lines S_WL may be stacked while surrounding the source-side half channel SCH, and the drain-side word lines D_WL may be stacked while surrounding the drain-side half channel DCH. The source-side word lines S_WL and the drain-side word lines D_WL may extend in parallel to a first direction I-I'. Furthermore, a source select line SSL may be formed over the source-side word lines S_WL, and a drain select line DSL may be formed over the drain-side word lines D_WL.

Source-side channels SCH of strings ST adjacent in a second direction II-II' may be connected to one source line SL, and drain-side channels DCH of strings ST extended in the second direction II-II' may be connected to one bit line BL.

Figure 5:
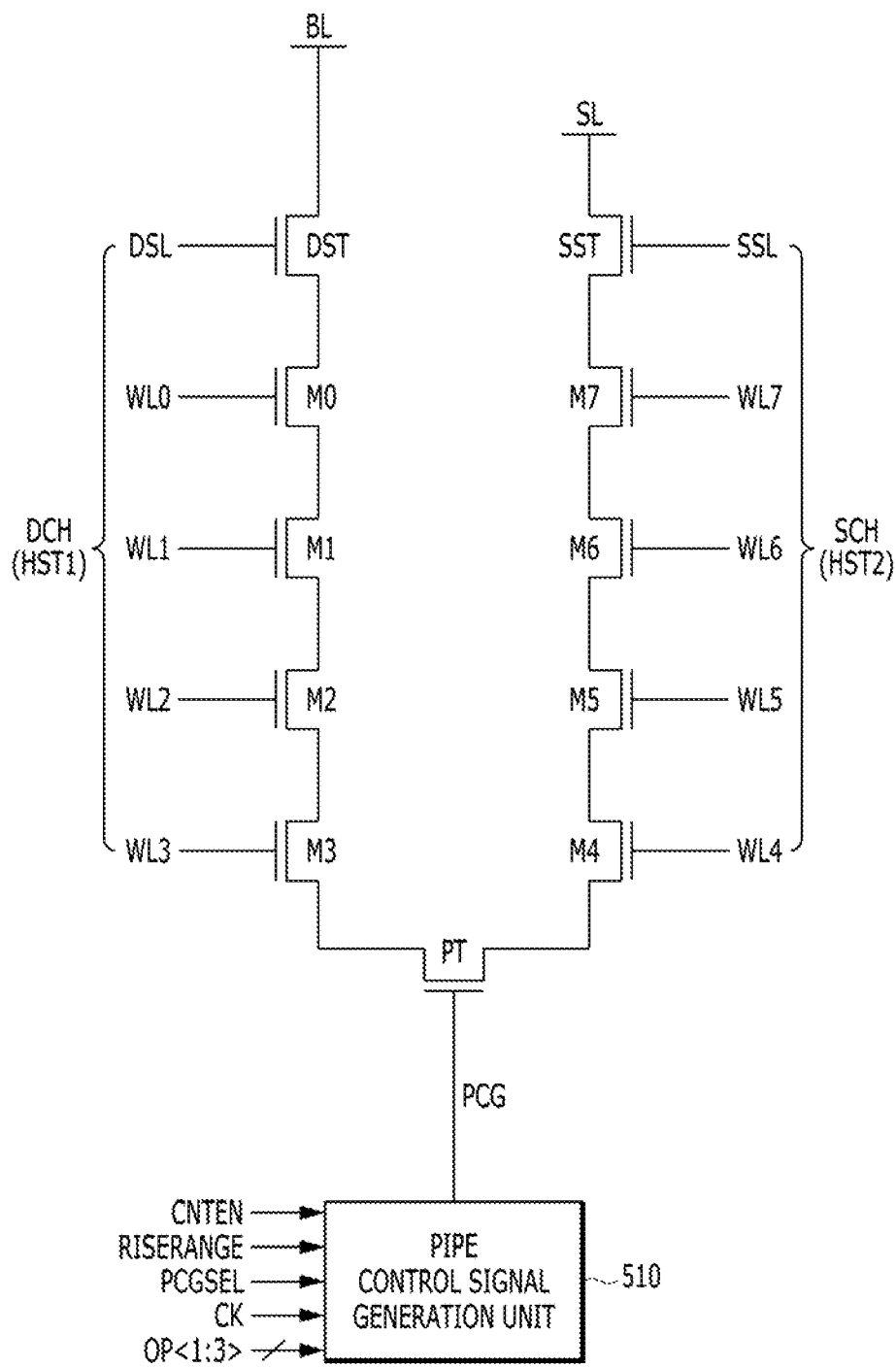
FIG. 5 is a circuit diagram illustrating a nonvolatile memory device in accordance with an embodiment of the present invention.

FIG. 5 is a circuit diagram illustrating a nonvolatile memory device in accordance with an embodiment of the present invention. FIG. 5 illustrates one string including a source-side half channel SCH, a pipe channel PCH, and a drain-side half channel DCH.

Referring to FIG. 5, the drain-side half channel DCH may include memory cells M0 to M3 and a drain select transistor DST. Each of the memory cells M0 to M3 may be Implemented with a transistor Including a floating gate. The pipe channel PCH may include a pipe transistor PT. The source-side half channel SCH may include memory cells M4 to M7 and a source select transistor SST. Each of the memory cells M4 to M7 may be implemented with a transistor including a floating gate.

In the above-described embodiment, the number of word lines WL0 to WL7 is set to 8, and the number of memory cells M0 to M7 included in one string is set to 8. However, this is only an example, and the number of word lines and the number of memory cells included in one string may be 32, 64 or the like.

The pipe transistor PT may be controlled by a pipe control signal PCG generated through a pipe control signal generation unit 510. The pipe control signal generation unit 510 of FIG. 5 may correspond to the control signal generation circuit of FIG. 1. Between the pipe transistor PT and the pipe control signal generation unit 510, a control signal transmission line may couple the pipe control signal generation unit 510 to a gate of the pipe transistor PT, and transmit the pipe control signal PCG from the pipe control signal generation unit 510 to the gate of the pipe transistor PT.

A first half string HST1 corresponding to the drain-side half channel DCH may include a drain select line DSL and the plurality of memory cells M0 to M3 coupled in series between the pipe transistor PT and the bit line BL. A second half string HST2 corresponding to the source-side half channel SCH may include a source select line SSL and the plurality of memory cells M4 to M7 coupled in series between the pipe transistor PT and the source line SL. The pipe transistor PT and the first and second half strings HST1 and HST2 form a U-shaped 3D full string.

When the first mode is set, the pipe control signal generation unit 510 may activate the pipe control signal PCG through two steps at time points set by the first and second rising information RISE1<0:M> and RISE2<0:M>, and deactivate the pipe control signal PCG through two steps at time points set by the first and second falling Information FALL1<0:M> and FALL2<0:M>, during a read or verify operation. Hereafter, a program operation, a verify operation, an erase operation, and a read operation of the nonvolatile memory device will be described as follows.

[Program Operation]

Hereafter, a program operation for programming the memory cell M0 will be taken as an example. During the program operation, a power supply voltage or ground voltage may be applied to the bit line BL according to the logic value of program data. The power supply voltage may be applied to the drain select line DSL and the source line SL, a pass voltage for turning on memory cells may be applied to the unselected word lines WL1 to WL7, a program voltage corresponding to a high voltage greater than or equal to 15V may be applied to the selected word line WL0, and the ground voltage may be applied to the source select line SSL. The memory cell M0 may be programmed when the voltage of the bit line BL is the ground voltage, and not programmed when the voltage of the bit line BL is the power supply voltage. Furthermore, the pass voltage may be applied to the pipe transistor PT.

[Erase Operation]

During the erase operation, an erase voltage corresponding to a high voltage of 15V may be applied to the bit line BL and the source line SL. At this time, a high voltage having a lower level than the erase voltage may be applied to the drain select line DSL and the source select line SSL, and the erase voltage may be applied to the pipe transistor PT. Furthermore, the ground voltage may be applied to the word lines WL0 to WL7. Then, as Gate Induced Drain Leakage (GIDL) occurs in the drain select transistor DST and the source select transistor SST, holes may be injected into the channel. As a result, the data of the memory cells M0 to M7 may be erased.

[Read or Verify Operation]

The read operation is to output data of a selected memory cell in response to a read command, and the verify operation is to output data of a selected memory cell to verify whether the selected memory cell was properly programmed. Thus, during the read and verify operations, similar voltages may be applied to the bit line BL, the source line SL, a selected word line, and unselected word lines. Hereafter, the read or verify operation when the memory cell M0 is read or verified will be taken as an example.

A predetermined precharge voltage of 1V, for example, may be applied to the bit line BL, and the ground voltage may be applied to the source line SL. Furthermore, a select voltage capable of turning on a corresponding transistor may be applied to the drain select line DSL and the source select line SSL. Furthermore, a read voltage or verify voltage for checking whether a threshold voltage of the selected memory cell is higher than a predetermined level may be applied to the selected word line WL0, and a pass voltage may be applied to the unselected word lines WL1 to WL7 and the pipe transistor PT. When the threshold voltage of the memory cell M0 is lower than the read voltage or verify voltage, a current path may be formed through the string ST including the memory cell M0. When the threshold voltage of the memory cell M0 is greater than or equal to the read voltage or verify voltage, no current path may be formed through the string ST including the memory cell M0. Thus, a voltage drop of the bit line BL or a current flowing from the bit line BL to the source line SL may be detected to determine the data value of the memory cell M0.

When the program operation or erase operation is performed, the pipe control signal PCG may be activated to the pass voltage or erase voltage from the ground voltage through one step, or deactivated to the ground voltage from the pass voltage or erase voltage through one step. During the read or verify operation, however, the pipe control signal PCG may be activated to the pass voltage from the ground voltage through two steps, or deactivated to the ground voltage from the pass voltage through two steps. The pipe control signal PCG will be described below in detail with reference to FIG. 6.

Figure 6:
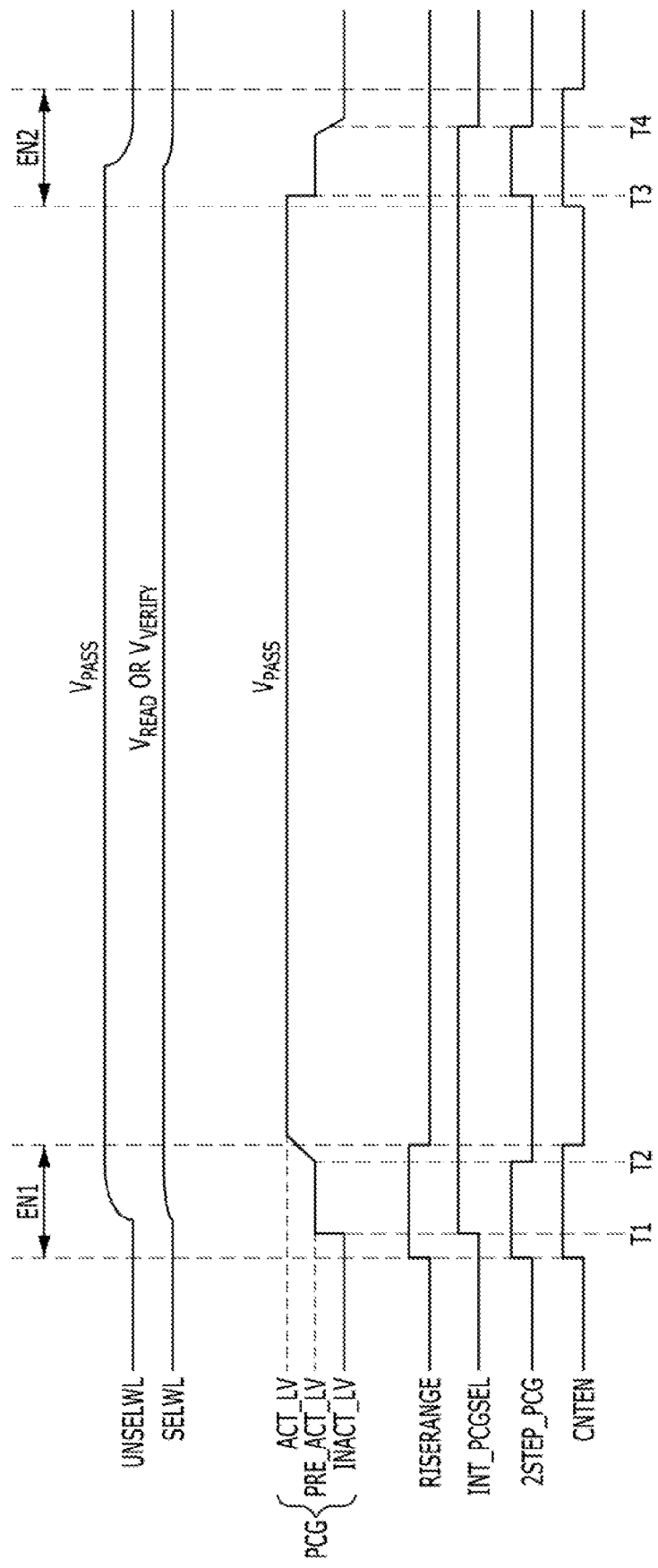
FIG. 6 is a timing diagram for describing an operation of a pipe control signal generation unit of the nonvolatile memory device illustrated in FIG. 5.

FIG. 6 is a timing diagram for describing an operation of the pipe control signal generation unit 510 of the nonvolatile memory device illustrated in FIG. 5.

Referring to FIG. 6, the operation of the pipe control signal generation unit 510 is described using waveforms of the signal CNTEN, the signal RISERANGE, the first signal INT_PCGSEL, the second signal 2STEP_PCG, and the control signal PCG. In FIG. 6, a reference numeral 'UNSELWL' represents a voltage waveform of the unselected word lines WL1 to WL7, and a reference numeral 'SELWL' represents a voltage waveform of the selected word line WL0.

The signal CNTEN may be activated during an enable period EN1 and a disable period EN2, and the signal RISERANGE may be activated during the enable period EN1. The enable period EN1 may correspond to the first period and the disable period EN2 may correspond to the second period. The enable period EN1 may indicate a period which is set to activate the pipe control signal PCG during the read or verify operation, and the disable period EN2 may indicate a period which is set to deactivate the pipe control signal PCG during the read or verify operation. The enable period EN1 may last for several micro seconds (µs) before and after the unselected word lines UNSELWL and the selected word line SELWL are enabled, and the disable period EN2 may last for several micro seconds (µs) before and after the unselected word lines UNSELWL and the selected word line SELWL are disabled.

At a start point of the enable period EN1 in which both of the signals CNTEN and RISERANGE are activated, the second signal 2STEP_PCG may be activated. During the enable period EN1, the first signal INT_PCGSEL may be activated when the value of the counting information CNT<0:M> is greater than or equal to the first rising Information RISE1<0:M> at a first time point T1, and the second signal 2STEP_PCG may be deactivated when the value of the counting information CNT<0:M> is greater than or equal to the second rising information RISE2<0:M> at a second time point T2.

During the disable period EN2, the second signal 2STEP_PCG may be activated when the value of the counting information CNT<0:M> is greater than or equal to the second falling Information FALL2<0:M> at a third time point T3, and the first signal INT_PCGSEL and the second signal 2STEP_PCG may be deactivated when the counting information CNT<0:M> is greater than or equal to the first falling information FALL1<0:M> at a fourth time point T4.

The unselected word lines UNSELWL may be activated to a pass voltage $V_{PASS}$ at a predetermined time point during the read or verify operation, and deactivated to the ground voltage at a predetermined time point after the read or verify operation is completed. The selected word line SELWL may be activated to a read voltage $V_{READ}$ or verify voltage $V_{VERIFY}$ at a predetermined time point during the read or verify operation, and deactivated to the ground voltage at a predetermined time point after the read or verify operation is completed.

The control signal PCG may be pre-activated to a pre-active level PRE_ACT_LV from an inactive level INACT_LV at the first time point T1, activated to an active level ACT_LV from the pre-active level PRE_ACT_LV at the second time point T2, pre-deactivated to the pre-active level PRE_ACT_LV from the active level ACT_LV at the third time point T3, and deactivated to the inactive level INACT_LV from the pre-active level PRE_ACT_LV at the fourth time point T4. The active level ACT_LV may correspond to the level of the pass voltage $V_{PASS}$, the pre-active level PRE_ACT_LV may correspond to a level obtained by subtracting a predetermined level from the active level ACT_LV, and the inactive level INACT_LV may correspond to a ground voltage level.

Referring to FIG. 5, the pipe control signal PCG may be pre-activated before the unselected word lines UNSELWL and the selected word line SELWL are enabled, and pre-deactivated before the unselected word lines UNSELWL and the selected word line SELWL are disabled. In the 3D nonvolatile memory device of FIG. 4, distances between the word lines WL0 to WL7 and the control signal transmission line through which the control signal PCG is transmitted may differ. Due to a loading difference between the word lines WL0 to WL7 and the control signal transmission line through which the control signal PCG is transmitted, a timing mismatch may occur between the signals. The nonvolatile memory device of FIG. 5 may selectively control the time points at which the pipe control signal PCG is pre-activated, activated, pre-deactivated, and deactivated, thereby minimizing the timing mismatch between the signals.

For reference, the pieces of information RISE1<0:M>, RISE2<0:M>, FALL1<0:M>, and FALL2<0:M> may be set to values at which the timings of the control signal PCG and the signals transmitted to the respective word lines are reliably matched based on a test result, after a test operation on the nonvolatile memory device is performed.

In accordance with the embodiments of the present invention, the control signal generation circuit may activate the signal for controlling a transistor coupling half strings of a nonvolatile memory device through two steps, thereby minimizing the influence of timing mismatch between signals due to line loading.

The control signal generation circuit may activate or deactivate the control signal in two steps, and selectively control the activation or deactivation point.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory device comprising:
    a pipe transistor controlled in response to a pipe control signal;
    a first half string comprising a plurality of first memory cells coupled in series between a bit line and the pipe transistor;
    a second half string comprising a plurality of second memory cells coupled in series between a source line and the pipe transistor; and
    a pipe control signal generation unit suitable for activating the pipe control signal through two steps at time points set by first and second rising information and deactivating the pipe control signal through two steps at time points set by first and second falling information during a read or verify operation, when a first mode is set.

2. The nonvolatile memory device of claim 1, wherein the pipe control signal generation unit drives the pipe control signal to a pre-active level at a time point set by the first rising information, drives the pipe control signal to an active level at a time point set by the second rising information, drives the pipe control signal to the pre-active level at a time point set by the second falling information, and drives the pipe control signal to an inactive level at a time point set by the first falling information.

3. The nonvolatile memory device of claim 2, wherein the second rising information is greater than the first rising information, and the first falling information is greater than the second falling information.

4. The nonvolatile memory device of claim 2, wherein the values of the first and second rising information and the first and second falling information are adjusted based on a test result.

5. The nonvolatile memory device of claim 1, wherein, when a second mode is set, the pipe control signal generation unit activates the pipe control signal through one step and deactivates the pipe control signal through one step, during the read or verify operation.

6. The nonvolatile memory device of claim 1, further comprising:
    a plurality of first word lines coupled to corresponding first memory cells, and vertically stacked between the bit line and the pipe transistor; and
    a plurality of second word lines coupled to corresponding second memory cells, and vertically stacked between the source line and the pipe transistor.

7. The nonvolatile memory device of claim 6, wherein the pipe transistor and the first and second half strings form a U-shaped 3D full string.

8. The nonvolatile memory device of claim 1, wherein the active level is a pass voltage level, the pre-active level is lower than the pass voltage level, and the inactive level is a ground voltage level.

9. The nonvolatile memory device of claim 1, wherein the pipe control signal generation unit activates the pipe control signal to a pass voltage level through one step during a program operation, and activates the pipe control signal to an erase voltage level through one step during an erase operation.

10. The nonvolatile memory device of claim 1, wherein, when the first mode is set, the pipe control signal generation unit activates the pipe control signal through two steps at time points set by the first and second rising information during an enable period, and deactivates the pipe control signal through two steps at time points set by the first and second falling information during a disable period, and
    when a second mode is set, the pipe control signal generation unit activates the pipe control signal at a predetermined time point of the enable period, and deactivates the pipe control signal at a predetermined time point of the disable period.

11. The nonvolatile memory device of claim 1, further comprising:
    a control signal transmission line suitable for coupling the pipe control signal generation unit to a gate of the pipe transistor, and transmitting the pipe control signal to the gate of the pipe transistor.

* * * * *